(12) United States Patent
Basker et al.

(10) Patent No.: US 9,966,454 B2
(45) Date of Patent: May 8, 2018

(54) CONTACT AREA TO TRENCH SILICIDE RESISTANCE REDUCTION BY HIGH-RESISTANCE INTERFACE REMOVAL

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 14/967,921

(22) Filed: Dec. 14, 2015

(65) Prior Publication Data
US 2017/0170290 A1 Jun. 15, 2017

(51) Int. Cl.
| | |
|---|---|
| *H01L 27/088* | (2006.01) |
| *H01L 29/66* | (2006.01) |
| *H01L 23/535* | (2006.01) |
| *H01L 29/78* | (2006.01) |
| *H01L 21/768* | (2006.01) |

(52) U.S. Cl.
CPC ...... *H01L 29/665* (2013.01); *H01L 21/76897* (2013.01); *H01L 23/535* (2013.01); *H01L 29/66545* (2013.01); *H01L 29/66795* (2013.01); *H01L 29/785* (2013.01)

(58) Field of Classification Search
CPC ............ H01L 29/665; H01L 29/66545; H01L 29/66795; H01L 29/785
See application file for complete search history.

(56) References Cited

U.S. PATENT DOCUMENTS

| | | | |
|---|---|---|---|
| 7,153,771 | B2 | 12/2006 | Eun |
| 8,435,901 | B2 | 5/2013 | Zin |
| 8,673,765 | B2 | 3/2014 | Wang et al. |
| 8,859,418 | B2 | 10/2014 | Huisinga et al. |
| 8,932,911 | B2 | 1/2015 | Huisinga et al. |
| 9,105,700 | B2 | 8/2015 | Indrakanti et al. |

(Continued)

FOREIGN PATENT DOCUMENTS

WO  2014131002 A1  8/2014

*Primary Examiner* — Mark Tornow
(74) *Attorney, Agent, or Firm* — Vazken Alexanian; Ryan, Mason & Lewis, LLP

(57) ABSTRACT

A method for manufacturing a semiconductor device comprises forming a silicide region on a semiconductor substrate, forming a gate structure on the semiconductor substrate adjacent the silicide region, forming a dielectric layer on the gate structure and on the silicide region, forming a first liner layer on the dielectric layer, removing a portion of the first liner layer and a portion of the dielectric layer to form an opening exposing a top surface of the silicide region, forming a second liner layer on the first liner layer and on sides and a bottom of the opening, removing a portion of the second liner layer from a top surface of the first liner layer and from the bottom of the opening to re-expose a portion of the top surface of the silicide region, and forming a contact layer in the opening directly on the re-exposed portion of the top surface of the silicide region.

18 Claims, 6 Drawing Sheets

(56) References Cited

U.S. PATENT DOCUMENTS

| | | | |
|---|---|---|---|
| 9,431,296 B2* | 8/2016 | Basker | H01L 21/76846 |
| 2007/0066047 A1 | 3/2007 | Ye et al. | |
| 2008/0290421 A1* | 11/2008 | Wang | H01L 21/28518 |
| | | | 257/384 |
| 2009/0212332 A1* | 8/2009 | Wang | H01L 29/4983 |
| | | | 257/288 |
| 2013/0062774 A1 | 3/2013 | Ko et al. | |
| 2013/0181264 A1* | 7/2013 | Liao | H01L 29/785 |
| | | | 257/288 |
| 2013/0217220 A1* | 8/2013 | Jagannathan | H01L 21/823821 |
| | | | 438/592 |
| 2014/0131881 A1* | 5/2014 | Wang | H01L 21/28518 |
| | | | 257/774 |
| 2014/0239395 A1 | 8/2014 | Basker et al. | |
| 2015/0079780 A1 | 3/2015 | Liu et al. | |
| 2015/0162280 A1 | 6/2015 | Pan et al. | |

* cited by examiner

CONTACT AREA TO TRENCH SILICIDE RESISTANCE REDUCTION BY HIGH-RESISTANCE INTERFACE REMOVAL

TECHNICAL FIELD

The field generally relates to semiconductor devices and methods of manufacturing same and, in particular, to semiconductor devices lacking a high-resistance interface between contact areas and trench silicide regions.

BACKGROUND

When scaling for next generation complementary metal-oxide semiconductor (CMOS) devices in connection with increased miniaturization, including, for example, very-large-scale integration (VLSI), middle-of-the-line (MOL) resistance can be a critical issue affecting device performance.

In conventional devices, increased MOL resistance can be caused by high-resistance interfaces between contact area (CA) metals and trench silicide (TS) regions. According to conventional processing, a liner that is needed for CA metallization, such as, for example, titanium nitride (TiN), has a high resistivity, and is positioned between a CA metal layer and a TS region. The liner, which is positioned as a high-resistance interface between the CA metal layer and a TS region, undesirably increases overall MOL resistance.

Accordingly, there is a need for a semiconductor device which does not include a high-resistance interface between the CA metal layer and a TS region and a method of manufacturing same.

SUMMARY

According to an exemplary embodiment of the present invention, a method for manufacturing a semiconductor device comprises forming a silicide region on a semiconductor substrate, forming a gate structure on the semiconductor substrate adjacent the silicide region, forming a dielectric layer on the gate structure and on the silicide region, forming a first liner layer on the dielectric layer, removing a portion of the first liner layer and a portion of the dielectric layer to form an opening exposing a top surface of the silicide region, forming a second liner layer on the first liner layer and on sides and a bottom of the opening, removing a portion of the second liner layer from a top surface of the first liner layer and from the bottom of the opening to re-expose a portion of the top surface of the silicide region, and forming a contact layer in the opening directly on the re-exposed portion of the top surface of the silicide region.

According to an exemplary embodiment of the present invention, a semiconductor device comprises a substrate, a gate structure on the substrate, a silicide region on the substrate adjacent the gate structure, a dielectric layer on the gate structure and on the silicide region, an opening in the dielectric layer formed over the silicide region, wherein the opening comprises a liner layer on sides of the opening, and a contact layer filling the opening and directly on the liner layer and a top surface of the silicide region.

According to an exemplary embodiment of the present invention, a method for manufacturing a semiconductor device comprises forming a fin on a semiconductor substrate, forming a plurality of silicide regions on the fin, forming a gate structure on the fin between the plurality of silicide regions, forming a dielectric layer on the gate structure and on the silicide regions, forming a first liner layer on the dielectric layer, removing a portion of the first liner layer and a portion of the dielectric layer to form a plurality of openings exposing a top surface of each silicide region, forming a second liner layer on the first liner layer and on sides and a bottom of each opening, removing a portion of the second liner layer from a top surface of the first liner layer and from the bottom of each opening to re-expose a portion of the top surface of each silicide region, and forming a contact layer in the openings directly on the re-exposed portion of the top surface of each silicide region.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
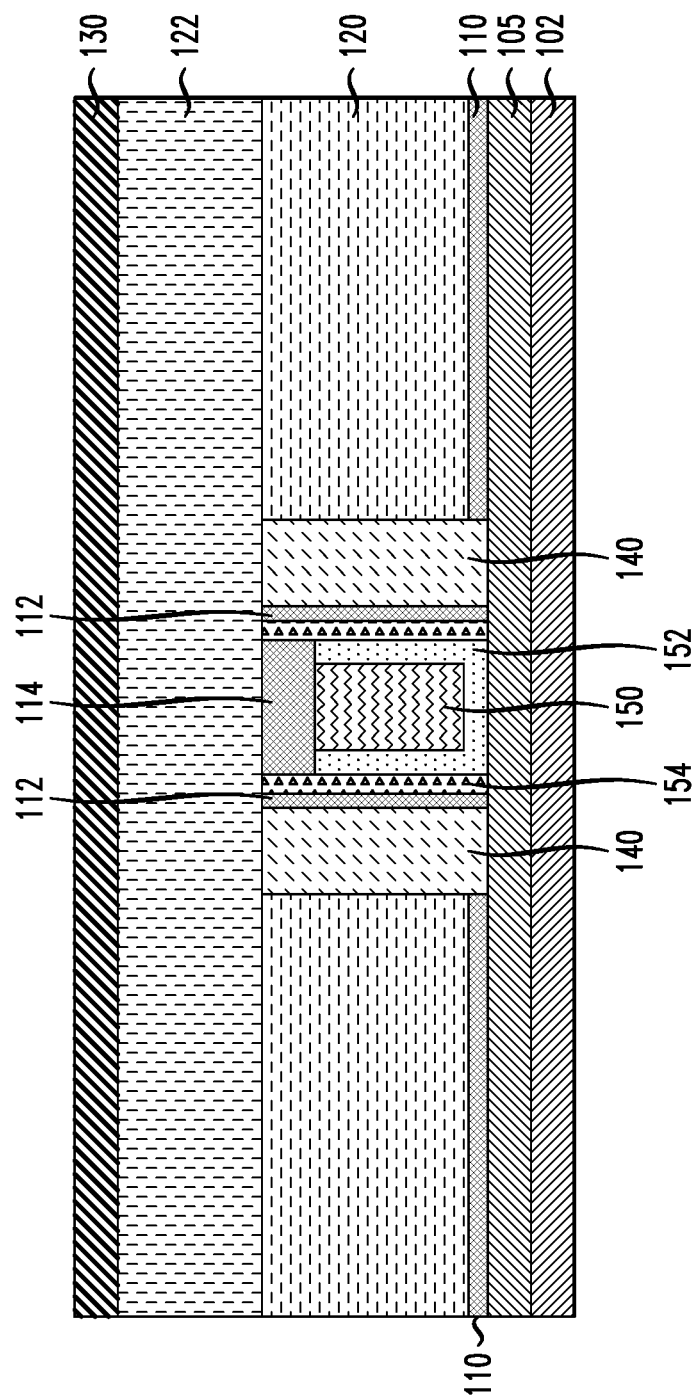
FIG. 1 is a cross-sectional view illustrating fabrication of a semiconductor device taken perpendicular to a gate extension direction and showing deposition of a dielectric layer and a first liner layer after completion of a replacement metal gate (RMG) process, according to an exemplary embodiment of the present invention.

Exemplary embodiments of the invention will now be discussed in further detail with regard to semiconductor devices and methods of manufacturing same and, in particular, to semiconductor devices lacking a high-resistance interface between contact areas and trench silicide regions.

It is to be understood that the various layers and/or regions shown in the accompanying drawings are not drawn to scale, and that one or more layers and/or regions of a type commonly used in complementary metal-oxide semiconductor (CMOS), fin field-effect transistor FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "parallel to a gate extension direction" refers to an extension direction of a gate structure perpendicular to a channel length (e.g., perpendicular to a fin extension direction).

As used herein, "perpendicular to a gate extension direction" or "across a channel of a gate structure" refers to a channel length direction of a gate structure (e.g., parallel to a fin extension direction) and to the left and right in the cross-sectional views herein, wherein source/drain regions are located to left and right sides of the gate structure in the cross-sectional views. In other words, left and right in these cross-sections represents a length of a fin and a channel length, and the width direction of the fin and a gate extension direction are going into the page.

As used herein, "height" refers to a vertical size of an element (e.g., a layer, trench, hole, etc.) in the cross-sectional figures measured from a bottom surface to a top surface of the element, and/or measured with respect to a surface on which the element is directly on. Conversely, a "depth" refers to a vertical size of an element (e.g., a layer, trench, hole, etc.) in the cross-sectional figures measured from a top surface to a bottom surface of the element.

As used herein, "lateral," "lateral side," "lateral surface" refers to a side surface of an element (e.g., a layer, opening, etc.), such as a left or right side surface in the cross-sectional figures.

As used herein, "width" refers to a horizontal size of an element (e.g., a layer, trench, hole, etc.) in the figures measured from a left or right side surface to an opposite surface of the element.

Embodiments of the present invention provide a method for removing an interface metal between a CA and a TS without removing a liner layer needed for CA metallization (e.g., TiN on sidewalls and on the outside of CA trench). The preservation of the liner layer on sidewalls and on the outside of CA trench prevents metal delamination. In accordance with one or more embodiments of the present invention, referring, for example, to FIG. 6 described herein below, the resulting device does not include a high-resistance interface between one or more CAs and TSs, so that overall MOL resistance is maintained at desirable levels.

FIG. 1 is a cross-sectional view illustrating fabrication of a semiconductor device taken perpendicular to a gate extension direction and showing deposition of a dielectric layer and a first liner layer after completion of a replacement metal gate (RMG) process, according to an exemplary embodiment of the present invention. Referring to FIG. 1, a semiconductor substrate 102 can be, for example, a bulk substrate or a silicon-on-insulator (SOI) substrate including a buried insulating layer, such as, for example, a buried oxide or nitride layer located on an upper surface of the semiconductor substrate. The substrate 102 may comprise semiconductor material including, but not limited to, Si, SiGe, SiC, SiGeC or other like semiconductor. In addition, multiple layers of the semiconductor materials can be used as the semiconductor material of the substrate.

In accordance with an embodiment of the present invention, as can be seen in FIG. 1, a fin 105 is formed on the substrate 102, using, for example, known methods of epitaxial growth and patterning.

As is known in the art, a fin of a FinFET can comprise, for example, silicon, and is a conducting channel that protrudes vertically from a substrate and extends in a direction from a source to a drain. As can be understood by one of ordinary skill in the art, a plurality of fins can be formed on the substrate 102 and spaced apart from each other at regular intervals along a gate extension direction. A plurality of gates can intersect the fins and extend perpendicular to the extension direction of the fins. Multiple gates can be spaced apart from each other along the extension direction of the fins.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

In an RMG process, a sacrificial material, which is replaced by a metal gate structure, is used to determine a geometry and location of the resulting metal gate structure. The sacrificial gate structure can comprise a material that can be selectively etched with respect to adjacent layers. For example, the sacrificial gate structure may comprise silicon, such as, polysilicon, and may be deposited and patterned. The sacrificial gate structure can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

During the RMG process, spacers 154 are formed adjacent to the sacrificial gate structure, to be in direct contact with opposing sidewalls of the sacrificial gate structure. The spacers 154 can include a dielectric insulating material such as, for example, silicon oxide, silicon nitride, silicon oxynitride, boron nitride, silicon boron nitride, or multilayered stacks thereof.

A first dielectric layer 120, comprising, for example, silicon dioxide ($SiO_2$), low-temperature oxide (LTO), high-temperature oxide (HTO), field oxide (FOX) or some other dielectric, is formed on the fin 105 adjacent sides of the spacers 154 and on the spacers 154 and the sacrificial gate structure using a deposition process, such as, for example, CVD, PECVD, RFCVD, PVD, ALD, MBD, PLD, and/or LSMCD. The first dielectric layer 120, and possibly top portions of the spacers 154 and the sacrificial gate structure are then planarized using a planarization process, such as, for example, chemical mechanical planarization (CMP), so that top surfaces of the first dielectric layer 120, spacers 154 and sacrificial gate structure are level with each other, and an upper surface of the sacrificial gate structure is exposed.

TS regions 140 are formed adjacent the spacers 154 and on the fin 105. The TS regions 140 can be formed by a lithography step first, then a reactive ion etching (ME) is used to open trenches next to spacers 154. After stripping of materials from the lithography step, a metal to form the silicide is deposited. The metal can include, but is not limited to, titanium, cobalt, tantalum, and nickel platinum. A CMP process can be used to remove the metal above dielectric layer 120. The TS regions 140 may comprise a silicide, including, for example, nickel silicide (NiSi), nickel platinum silicide ($NiPt_ySi_x$) cobalt silicide ($CoSi_x$) tantalum silicide ($TaSi_x$), titanium silicide ($TiSi_x$) and combinations thereof.

The sacrificial gate structure is removed to provide an opening exposing a portion of the fin 105 and in which the resulting gate structure is to be formed. The sacrificial gate structure can be removed using a selective etch process that selectively removes the sacrificial gate structure with respect to the first dielectric layer 120, TS regions 140, and spacers 154. The etch can be, for example, an isotropic etch, such as a wet chemical etch, or an anisotropic etch, such as RIE, ion beam etching, plasma etching or laser ablation.

A metal gate structure is formed in the opening left after removal of the sacrificial gate structure. Referring to FIG. 1, the gate structure is formed on the fin 105. The gate structure includes, for example, low resistance metal 150, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof, and a dielectric 152 such as, for example, a high-K dielectric including but not limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate structure may be formed using, for example, deposition techniques including, but not limited to, CVD, PECVD, RFCVD, PVD, ALD, MBD, PLD, and/or LSMCD, sputtering, and/or plating. The spacers 154 are located on the metal gate structure, having a first edge located on a vertical sidewall the gate structure and a base that is located on the fin 105. As can be understood by one of ordinary skill in the art, a plurality of gate structures can be formed on one or more fins, and spaced apart from each other along a length (e.g., extension) direction of the fins.

After formation of the replacement gate structure in the RMG process, a second dielectric layer 122 is deposited on top of the gate structure, TS regions 140 and first dielectric layer 120. The second dielectric layer 122 can comprise the same material as or a different dielectric material from the first dielectric layer 120, and may be formed using, for example, deposition techniques including, but not limited to, CVD, PECVD, RFCVD, PVD, ALD, MBD, PLD, and/or LSMCD, sputtering, and/or plating.

The first and second dielectric layers 120 and 122 can be referred to as inter-layer dielectric (ILD) layers. Silicon nitride layers 110, 112 and 114 are formed on the fin 105 between the fin 105 and the first dielectric layer 120, on the spacers 154 between the spacers 154 and the TS regions 140, and on the gate structure including the gate metal 150 and dielectric 152, between the gate structure and second dielectric layer 122. The SiN layers 110 and 112 are formed prior to deposition of the first dielectric layer 120, and the SiN layer 114 is formed prior to deposition of the second dielectric layer using a deposition method, such as, for example, CVD, PECVD, RFCVD, PVD, ALD, MBD, PLD, and/or LSMCD, sputtering, and/or plating.

As shown in FIG. 1, a first liner layer 130 comprising, for example, TiN, tantalum nitride (TaN) or ruthenium, is formed on the second dielectric layer 122 using, for example, a deposition technique including but not limited to, CVD, PECVD, RFCVD, PVD, ALD, MBD, PLD, and/or LSMCD, sputtering, and/or plating. According to an embodiment, a height (i.e., thickness) of the first liner layer 130 can be, for example, about 5 nm-about 50 nm.

Figure 2:
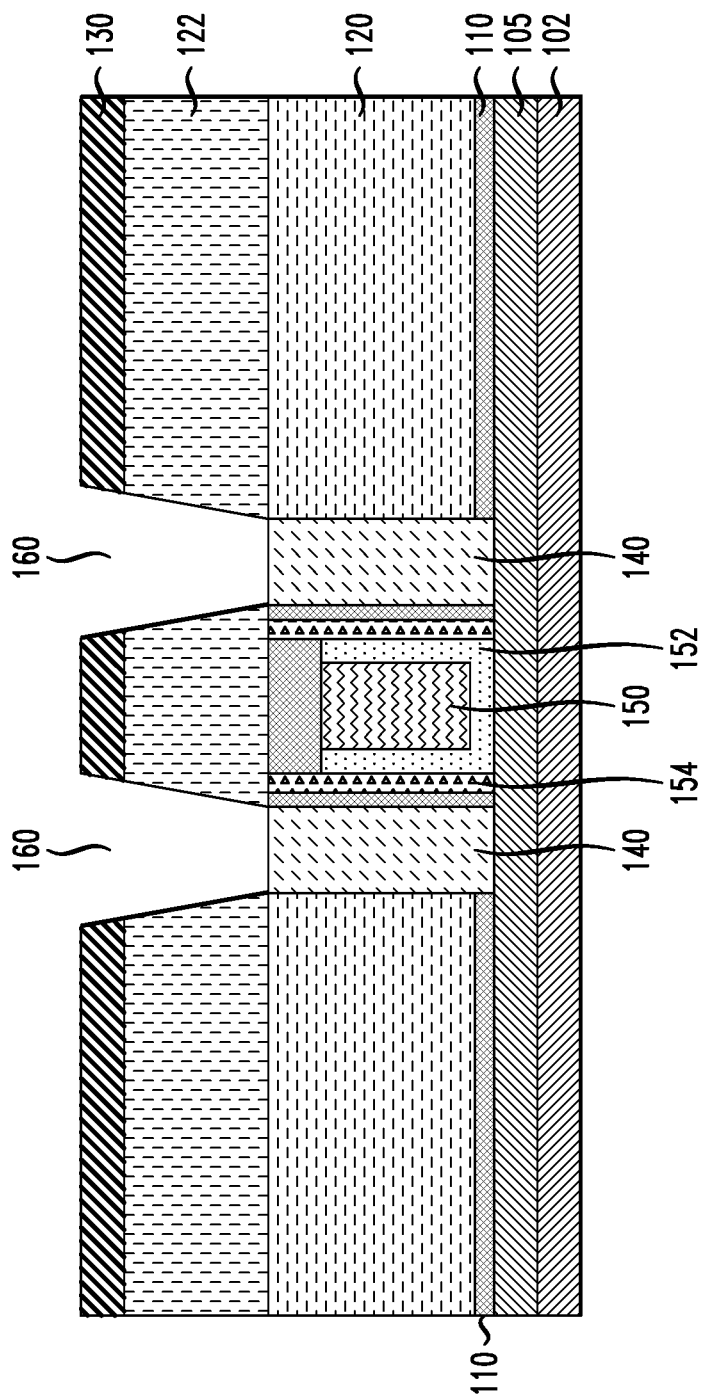
FIG. 2 is a cross-sectional view illustrating fabrication of a semiconductor device taken perpendicular to a gate extension direction and showing patterning of the layers over trench silicide (TS) regions, according to an exemplary embodiment of the present invention.

FIG. 2 is a cross-sectional view illustrating fabrication of a semiconductor device taken perpendicular to a gate extension direction and showing patterning of the second dielectric layer 122 and first liner layer 130 over the TS regions 140, according to an exemplary embodiment of the present invention. Referring to FIG. 2, patterning is performed by a method known in the art, for example, RIE to remove portions of the first liner layer 130 and the second dielectric layer 122 to form openings 160 (e.g., trenches) exposing the TS regions 140. A depth of the openings 160 can be, for example, in the range of about 20 nm-about 50 nm.

Figure 3:
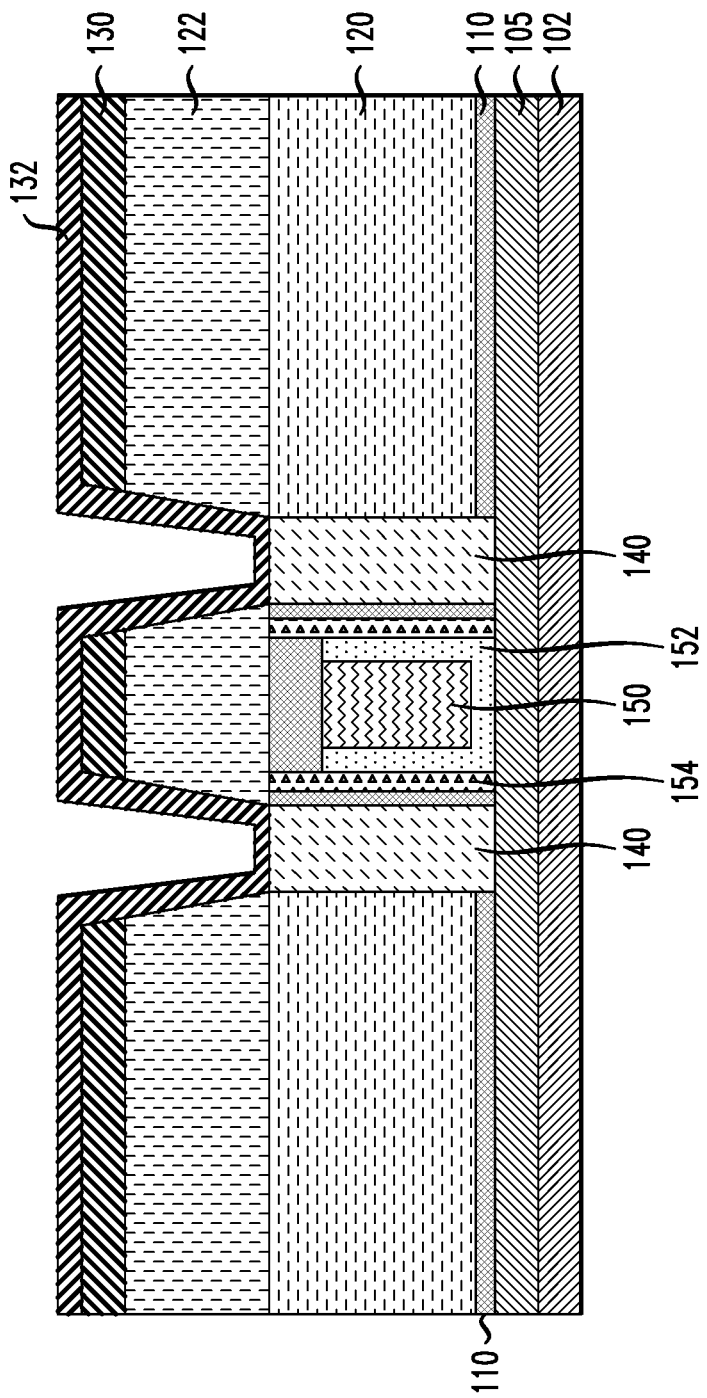
FIG. 3 is a cross-sectional view illustrating fabrication of a semiconductor device taken perpendicular to a gate extension direction and showing deposition of a second liner layer, according to an exemplary embodiment of the present invention.

FIG. 3 is a cross-sectional view illustrating fabrication of a semiconductor device taken perpendicular to a gate extension direction and showing deposition of a second liner layer, according to an exemplary embodiment of the present invention. Referring to FIG. 3, a second liner layer 132 comprising, for example, TiN, tantalum nitride (TaN) or ruthenium, is formed on the first liner layer 130, and in the openings 160 on sidewalls of the openings 160 and on the exposed TS regions 140, using, for example, a deposition technique including but not limited to, CVD, PECVD, RFCVD, PVD, ALD, MBD, PLD, and/or LSMCD, sputtering, and/or plating. The second liner layer 132 can comprise the same material as the first liner layer 130. According to an embodiment, a height (i.e., thickness) of the second liner layer 132 can be, for example, about 1 nm to about 4 nm.

Figure 4:
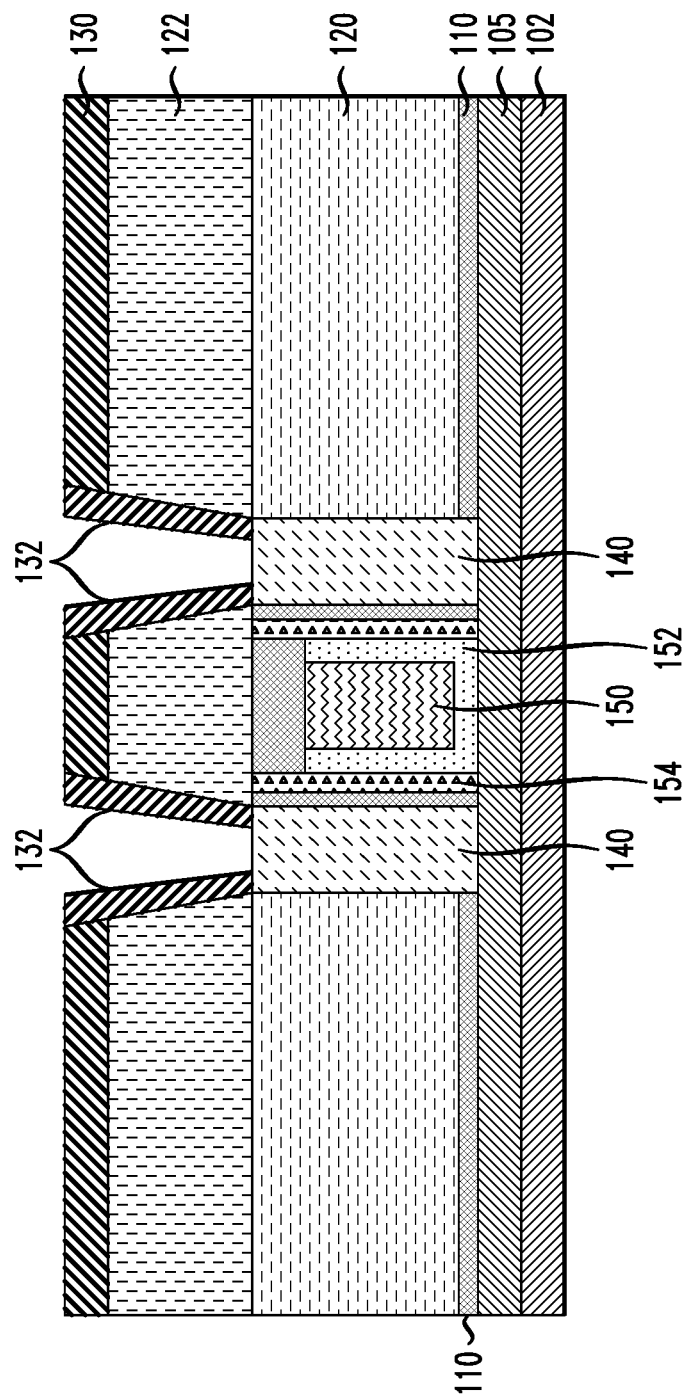
FIG. 4 is a cross-sectional view illustrating fabrication of a semiconductor device taken perpendicular to a gate extension direction and showing removal of a portion of the second liner layer, according to an exemplary embodiment of the present invention.

FIG. 4 is a cross-sectional view illustrating fabrication of a semiconductor device taken perpendicular to a gate extension direction and showing removal of a portion of the second liner layer, according to an exemplary embodiment of the present invention. Referring to FIG. 4, a portions of the second liner layer 132 on the first liner layer 130 outside of the openings 160, and portions of the second liner 132 at the bottom of the openings 160 are removed to expose parts of the first liner layer 130 and the parts of the TS regions 140 that were under the removed portions of the second liner layer 132. The removal of the portions of the second liner layer 132 can be performed using, for example, a gas cluster ion beam (GCM) process, a sputter etch process or other directional or anisotropic removal process capable of removing portions of the second liner layer 132 on the first liner layer 130 outside of the openings 160, and portions of the second liner 132 at the bottom of the openings 160, while portions of the second liner layer 132 remain on the sidewalls of the openings 160.

Figure 5:
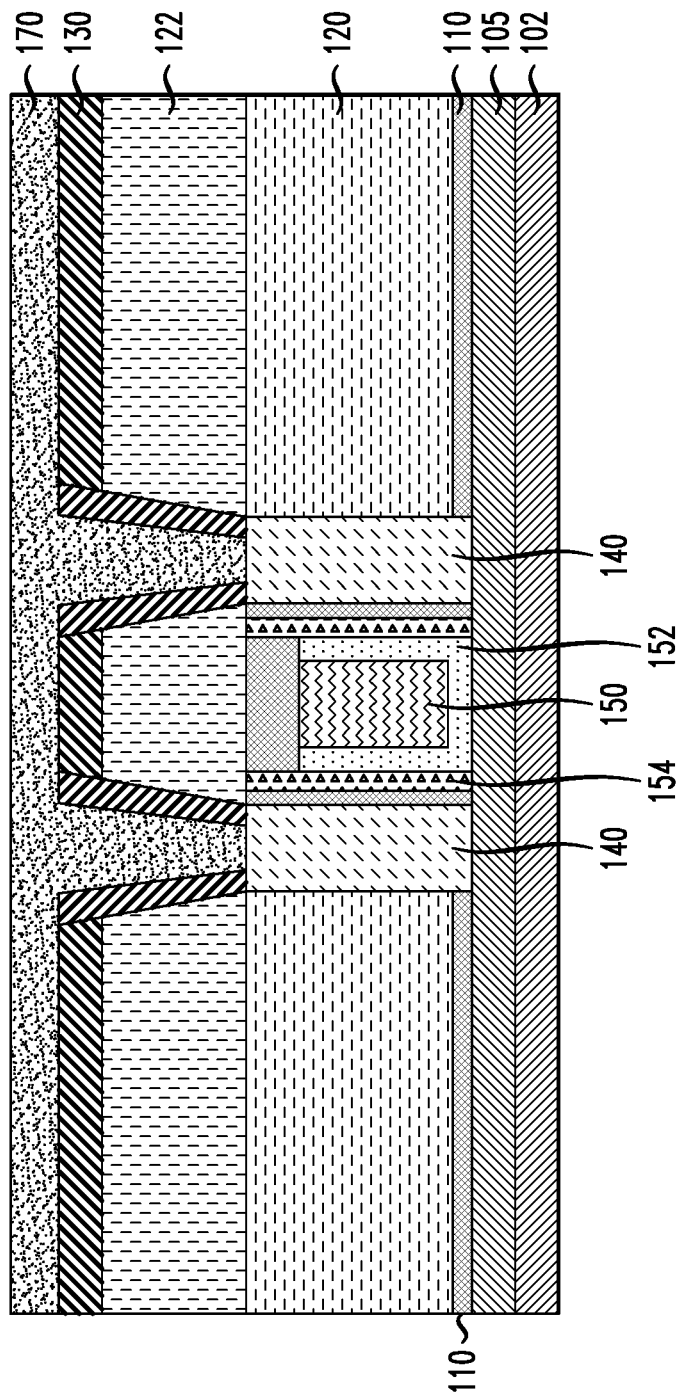
FIG. 5 is a cross-sectional view illustrating fabrication of a semiconductor device taken perpendicular to a gate extension direction and showing deposition of a contact area (CA) metal, according to an exemplary embodiment of the present invention.

FIG. 5 is a cross-sectional view illustrating fabrication of a semiconductor device taken perpendicular to a gate extension direction and showing deposition of a contact area (CA) metal, according to an exemplary embodiment of the present invention. Referring to FIG. 5, a CA metal 170, such as, for example, tungsten, cobalt, ruthenium, copper, or combinations thereof, is deposited on exposed portions of the first and second liner layers 130 and 132, and the TS regions 140. The CA metal 170 may be formed using, for example, deposition techniques including, but not limited to, CVD, PECVD, RFCVD, PVD, ALD, MBD, PLD, and/or LSMCD, sputtering, and/or plating.

Figure 6:
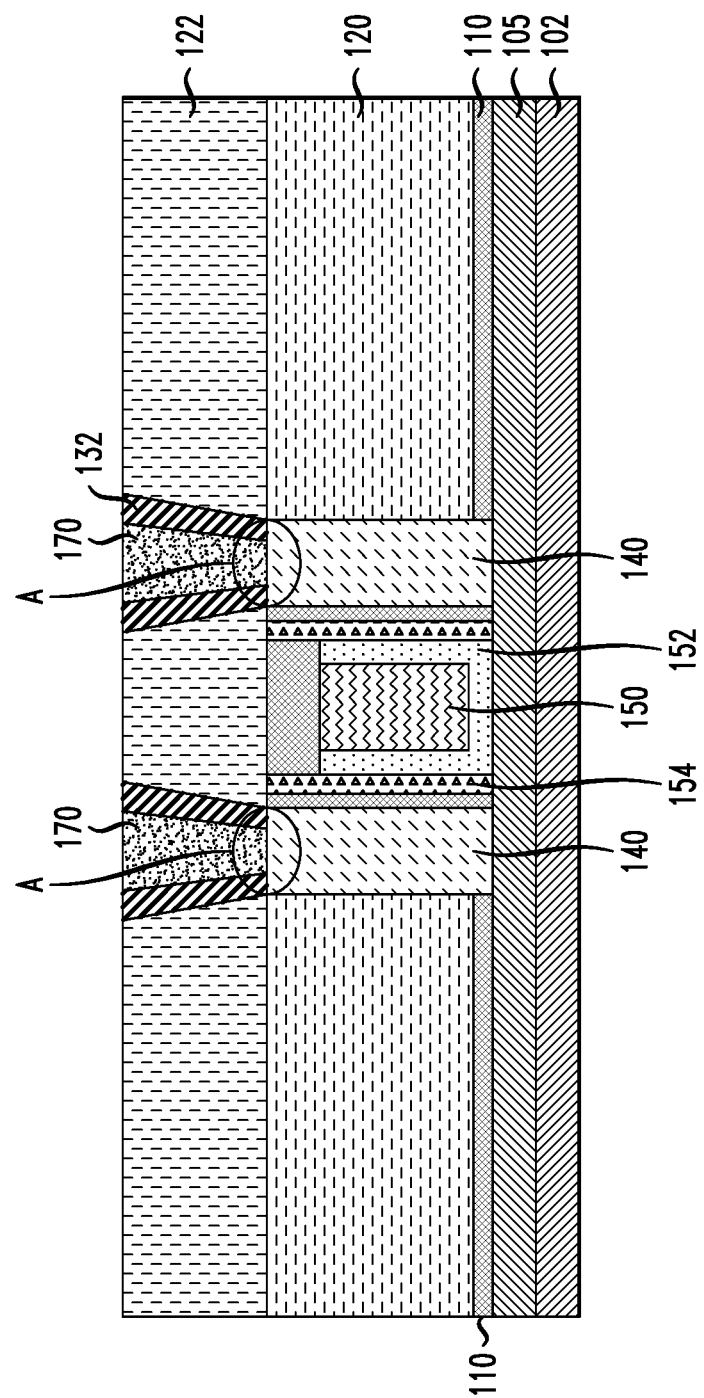
FIG. 6 is a cross-sectional view of a semiconductor device taken perpendicular to a gate extension direction and showing removal and planarization of the first liner layer and portions of the CA metal and the second liner layer, according to an exemplary embodiment of the present invention.

FIG. 6 is a cross-sectional view of a semiconductor device taken perpendicular to a gate extension direction and showing removal and planarization of the first liner layer and portions of the CA metal and the second liner layer, according to an exemplary embodiment of the present invention. Referring to FIG. 6, the first liner layer 130 and portions of the CA metal 170 and the second liner layer 132 are removed using a planarization process, such as, for example, CMP. As shown in FIG. 6, the planarization is performed down to the second dielectric layer 122 to expose top surface portions of the second dielectric layer 122 and the second liner layer 132, and make a top surface of the CA metal 170 level with the top surface portions of the second dielectric layer 122 and the second liner layer 132. As shown in FIG. 6, the circled regions A indicate interface free regions between the CA metal layers 170 and the corresponding TS regions 140, such that the CA metal layers 170 are directly on the corresponding TS regions 140, and there is no high-resistance liner between the CA metal layers 170 and the corresponding TS regions 140. As a result, overall MOL resistance is maintained at desirable levels, while still providing the requisite liner layers 130, 132 (see FIG. 4) to permit CA metallization (see FIG. 5) without metal delamination.

While the embodiments of the present invention are illustrated as a FinFET device, including contact areas and trench silicide regions connecting to a fin, it is to be understood that the embodiments of the present invention are not necessarily limited to FinFET devices, and can be applied to other semiconductor devices where contact areas and silicide regions connect to source/drain regions of one or more gates.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
    forming a first dielectric layer on a base, wherein the base comprises a semiconductor substrate;
    forming a silicide region on the base adjacent to the first dielectric layer;
    forming a gate structure on the base laterally adjacent to the silicide region;
    wherein top surfaces of the first dielectric layer and the silicide region are at a height above the base that is higher than a top surface of the gate structure;
    forming a second dielectric layer on the gate structure, the silicide region, and the first dielectric layer;
    forming a first liner layer on the second dielectric layer;
    removing a portion of the first liner layer and a portion of the second dielectric layer to form an opening exposing the top surface of the silicide region;
    forming a second liner layer on the first liner layer and on sides and a bottom of the opening;
    removing a portion of the second liner layer from a top surface of the first liner layer and from the bottom of the opening to re-expose a portion of the top surface of the silicide region; and
    forming a contact layer in the opening directly on the re-exposed portion of the top surface of the silicide region.

2. The method according to claim 1, wherein removing the portion of the second liner layer from the top surface of the first liner layer exposes the top surface of the first liner layer, and the contact layer is formed on the exposed top surface of the first liner layer.

3. The method according to claim 2, further comprising planarizing the first liner layer and portions of the contact layer and the second liner layer down to the second dielectric layer.

4. The method according to claim 1, wherein the second liner layer remains on the sides of the opening after removing the portion of the second liner layer from the top surface of the first liner layer and from the bottom of the opening.

5. The method according to claim 4, wherein the contact layer is formed on the second liner layer remaining on the sides of the opening.

6. The method according to claim 1, wherein the base further comprises a fin formed on the semiconductor substrate, and wherein the silicide region and the gate structure are formed on the fin.

7. The method according to claim 1, wherein the gate structure is formed by replacing a sacrificial gate structure with the gate structure during a replacement metal gate process.

8. The method according to claim 1, wherein the silicide region comprises at least one of nickel silicide (NiSi), nickel platinum silicide ($NiPt_ySi_x$), cobalt silicide ($CoSi_x$), tantalum silicide ($TaSi_x$), and titanium silicide ($TiSi_x$).

9. The method according to claim 1, wherein the first liner layer comprises at least one of titanium nitride (TiN), tantalum nitride (TaN) and ruthenium.

10. The method according to claim 1, wherein the second liner layer comprises at least one of titanium nitride (TiN), tantalum nitride (TaN) and ruthenium.

11. The method according to claim 1, wherein the contact layer comprises at least one of tungsten, cobalt, ruthenium and copper.

12. The method according to claim 1, wherein removing the portion of the second liner layer from the top surface of the first liner layer and from the bottom of the opening is performed using a gas cluster ion beam (GOB) process.

13. The method according to claim 1, wherein removing the portion of the second liner layer from the top surface of the first liner layer and from the bottom of the opening is performed using a sputtering process.

14. The method according to claim 1, further comprising forming a first silicon nitride layer and a second silicon nitride layer on the semiconductor substrate, wherein the first dielectric layer is formed on the first silicon nitride layer.

15. The method according to claim 1, wherein the top surfaces of the first dielectric layer and the silicide region are coplanar with each other.

16. A method for manufacturing a semiconductor device, comprising:
    forming a fin on a semiconductor substrate;
    forming a first silicon nitride layer and a second silicon nitride layer on the fin;
    forming a first dielectric layer on the first silicon nitride layer;
    forming a plurality of silicide regions on the fin adjacent to the first silicon nitride layer, the second silicon nitride layer and the first dielectric layer;
    forming a gate structure on the fin between the plurality of silicide regions;
    wherein top surfaces of the first dielectric layer and the plurality of silicide regions are at a height above the fin that is higher than a top surface of the gate structure;
    forming a second dielectric layer on the gate structure, the plurality of silicide regions, and the first dielectric layer;
    forming a first liner layer on the second dielectric layer;
    removing a portion of the first liner layer and a portion of the second dielectric layer to form a plurality of openings exposing the top surface of each silicide region;
    forming a second liner layer on the first liner layer and on sides and a bottom of each opening;
    removing a portion of the second liner layer from a top surface of the first liner layer and from the bottom of each opening to re-expose a portion of the top surface of each silicide region; and
    forming a contact layer in the openings directly on the re-exposed portion of the top surface of each silicide region.

17. The method according to claim 16, wherein:
    the second liner layer remains on the sides of the openings after removing the portion of the second liner layer from the top surface of the first liner layer and from the bottom of each opening; and
    the contact layer is formed on the second liner layer remaining on the sides of the openings.

18. The method according to claim 16, wherein the top surfaces of the first dielectric layer and the plurality of silicide regions are coplanar with each other.

* * * * *